United States Patent [19]
Takahashi et al.

[11] Patent Number: 6,121,171
[45] Date of Patent: Sep. 19, 2000

[54] COMPOSITE FILM COMPRISING LOW-DIELECTRIC RESIN AND PARAORIENTED AROMATIC POLYAMIDE

[75] Inventors: Tsutomu Takahashi; Hiroaki Kumada, both of Ibaraki, Japan

[73] Assignee: Sumitomo Chemical Company, Ltd., Osaka, Japan

[21] Appl. No.: 09/056,864

[22] Filed: Apr. 8, 1998

[30] Foreign Application Priority Data

Apr. 8, 1997 [JP] Japan ................................ 9-106689

[51] Int. Cl.⁷ ..................................... B32B 27/34
[52] U.S. Cl. ..................... 442/289; 442/291; 442/286; 428/308.4
[58] Field of Search .................... 442/289, 291, 442/286; 428/308.4

[56] References Cited

U.S. PATENT DOCUMENTS 4,895,752  1/1990  McEwen ................................ 442/233
5,851,646  12/1998 Takahashi et al. ................... 428/294.1

FOREIGN PATENT DOCUMENTS 0 320 901  6/1989  European Pat. Off. .
0 757 071  2/1997  European Pat. Off. .
0 768 334  4/1997  European Pat. Off. .

*Primary Examiner*—Blaine Copenheaver
*Assistant Examiner*—John J. Guarriello
*Attorney, Agent, or Firm*—Sughrue, Mion, Zinn, Macpeak & Seas, PLLC

[57] ABSTRACT

Provided is a composite film comprising a continuous phase of para-oriented aromatic polyamide and a phase of low-dielectric resin, said film having a dielectric constant at 1 MHz of not more than 3.2 and a linear thermal expansion coefficient at 200 to 300° C. of within $\pm 50 \times 10^{-6}$/°C. The composite film has characteristics such as a low dielectric constant, favorable mechanical strength, homogeneous structure, light weight, and a low linear thermal expansion coefficient, and the film is useful as a base substrate for a flexible printed circuit board.

16 Claims, 3 Drawing Sheets

COMPOSITE FILM COMPRISING LOW-DIELECTRIC RESIN AND PARAORIENTED AROMATIC POLYAMIDE

BACKGROUND OF THE INVENTION

1. Field of the Invention

The present invention relates to a composite film comprising a para-oriented aromatic polyamide and a low dielectric resin.

2. Description of the Related Art

The high-speed signal processing and digitizing techniques have been highly demanded for high-performance electronic instruments. A laminated board including a non-woven fabric of aromatic polyamide (hereinafter may be referred to as aramid) as a base substrate has characteristics such as low dielectric constant, light weight, and low linear thermal expansion coefficient. Various applications of the laminated board have been developed especially in the field of multi-layer printed circuit boards. Although a polyimide film has been used for the flexible boards, further reduction in dielectric constant is required for high-speed signal processing.

Aromatic aramids are mainly divided into two groups; that is, meta-oriented aromatic polyamides (hereinafter may be referred to as meta-aramid) and para-oriented aromatic polyamides (hereinafter may be referred to as para-aramid). Paper made of meta-aramid has practically sufficient strength and tear strength, but the large linear thermal expansion coefficient makes the paper unsuitable as a printed circuit board. The para-amide fibers have excellent properties, such as high strength, high stiffness, high heat resistance, and low linear thermal expansion coefficient. On the other hand, since para-aramid does not melt, para-aramid paper manufactured from para-aramid pulp does not have agglomerated portions. The para-aramid paper accordingly has low strength and difficulties in handling for the printed circuit board. Thus, heat-resistance resins are widely used as a binder of para-aramid paper or non-woven fabric.

For example, U.S. Pat. No. 5,314,742 describes that a non-woven fabric composed of meta-aramid fibrils and para-aramid flocks has a low linear thermal expansion coefficient and is effectively used as the base substrate of a laminated board. JP-A-5-327148 describes that cloth, paper, and non-woven fabric containing para-aramid fibers at least 50% as a base substrate decreases the linear thermal expansion coefficient in the planar direction. However, it is difficult to obtain a non-woven fabric of uniform formation, and further improvement has been demanded. The dielectric constant at 1 MHz of para-aramid is 3.5, and the conventional technique of simply impregnating para-aramid with epoxy resin to produce a prepreg for a printed circuit board can not sufficiently reduce the dielectric constant.

Several methods of adding a low dielectric constant fluororesin to a base substrate for the purpose of lowering the dielectric constant are disclosed. EP-A-320901 discloses a method for producing a laminated board comprising a fluororesin reinforced with a woven fabric of a nonwoven fabric of aramid. However, the diameter of the fiber composing the above woven and nonwoven fabric is about 15–20 $\mu$m, and recently, a base substrate having more uniform formation and textile is desired in view of the necessity of fine patterning during the production of printed circuit board.

Similarly, for lowering the dielectric constant, JP-A-4-55437 discloses a woven or nonwoven fabric comprising aramid fiber impregnated with a dispersed solution of fluororesin and glass beads, and JP-A-2-268486 discloses a board material using a base substrate prepared by paper-making a mixture of fluororesin fiber and organic fiber. However, either method loses a required high uniformity of the base substance for fine patterning.

HP-B-1-33493 discloses a method that an aqueous dispersion of fluororesin applied on the surface of an aromatic polyamide film is dried and heat-treated to produce a fluororesin layer on a single face or both faces of the aromatic polyamide film.

Methods of producing a laminated film having low dielectric constant as a whole by laminating a fluororesin-containing layer on a layer comprising a thermosetting resin and a base substrate (JP-B-6-94206), or on a layer comprising a combination of a fluororesin and fiber-reinforcing material (JP-A-3-273695).

These laminated films, being made of different materials and layers, are not uniform as a whole film.

Moreover, a method of further laminating a low conductive layer cannot make a printed circuit board thin.

As a low dielectric constant film, Polymer Preprints (Vol. 37, No. 1, p160, 1996, Division of Polymer Chemistry, Inc. American Chemical Society) describes an aromatic polyester film containing pores. It is proposed that pores composed of air phase of low dielectric constant are formed in the aromatic polyester having a low linear thermal expansion coefficient in order to lower the dielectric constant of the polyester. However, the pores formed in the film may cause a problem such as contamination of an etching solution or flow-in of the water in the processing procedure of the printed circuit board.

An object of the present invention is to provide a composite film that is light in weight, has a low dielectric constant, a low linear thermal expansion coefficient, homogeneous structure, and favorable mechanical strength for a printed circuit board, as well as to provide a base substrate for a flexible printed circuit board using such a film.

Another object of the present invention is to provide especially a porous composite film and a prepreg prepared by impregnating the porous composite film with a thermoplastic resin and/or a thermosetting resin.

Still another object of the present invention is to provide a printed circuit board having a laminated board using such a prepreg.

SUMMARY OF THE INVENTION

The present invention relates to a composite film comprising a continuous phase of para-oriented aromatic polyamide and a phase of low-dielectric resin, wherein the film having a dielectric constant at 1 MHz of not more than 3.2 and a linear thermal expansion coefficient at 200 to 300° C. of within $\pm 50 \times 10^{-6}$/°C.

The present invention also relates to the composite film further comprising heat-resistant short fiber and/or pulp which does not melt at a temperature of lower than 230° C.

In accordance with one preferable application of the present invention, the continuous phase of para-oriented aromatic polyamide has a laminated structure of fibrils which have diameters of not more than 1 $\mu$m and are arranged in a form of a planar network or in a form of a planar non-woven fabric.

In accordance with another preferable application of the present invention, the composite film is a porous composite film having a percentage of vacant spaces of 30 to 95%.

The present invention is also directed to a prepreg comprising a porous composite film that has vacant spaces therein and is impregnated with a thermoplastic resin and/or a thermosetting resin.

The present invention is further directed to a flexible printed circuit board using the above composite film, a base substrate for a printed circuit board using the above prepreg, and a printed circuit laminated board using the base substrate for a printed circuit board as an insulating layer and a metallic foil as a conductive layer.

DETAILED DESCRIPTION OF THE INVENTION

Figure 1:
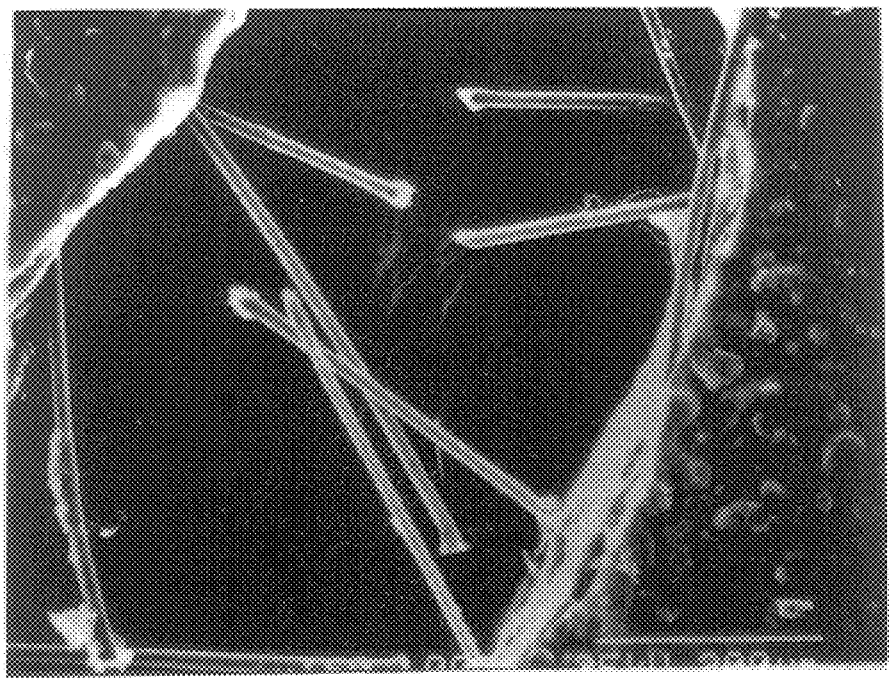
FIG. 1 is a photograph of a scanning electron microscope (magnification of 150) showing the form of fibrils of a composite film obtained in Example 2 (structure of a torn portion of a porous composite film).

The present invention is described more in detail. The composite film of the present invention has a structure comprising a continuous phase of para-oriented aromatic polyamide and a phase of low-dielectric resin. The continuous phase implies the state in which a material exists in a uniform formation from the surface of one plane of the film to the other plane via the inside of the film. The phase of low-dielectric resin, on the other hand, implies the state in which the low-dielectric resin is dispersed in the vacant spaces of the continuous phase or filled in the vacant spaces of the continuous phase. A part of the low-dielectric resin may exist on the surface of the film. The composite film of the present invention has a dielectric constant of not more than 3.2 and a linear thermal expansion coefficient of within $\pm 50 \times 10^{-6}/°C$. at 200 to 300° C.

The composite film of the present invention is mainly composed of a low-dielectric resin and para-aramid. The para-aramid portions are made of para-aramid fibrils and microscopically show the form of non-woven fabric. The para-aramid phase of the composite film of the present invention has a laminate structure of fibrils which have diameters of not more than 1 μm and are arranged in a form of a planar net or in a form of a planar non-woven fabric. The planar arrangement here implies that the fibrils are disposed in parallel to the film surface.

The para-oriented aromatic polyamide forming the continuous phase of the present invention is obtained by condensation polymerization of a para-oriented aromatic diamine and a para-oriented aromatic dicarboxylic acid halide. The para-oriented aromatic polyamide substantially comprise a repeating unit wherein an amide bond is bound at the para-site or the equivalently oriented site of the aromatic ring (for example, the oriented site extending coaxially or in parallel to the opposite direction, such as 4,4'-biphenylene, 1,5-naphthalene, and 2,6-naphthalene).

Concrete examples of the para-aramid are those having the para-oriented or the equivalently oriented structure and include poly(para-phenylene terephthalamide), poly(parabenzamide), poly(4,4'-benzanilide terephthalamide), poly (para-phenylene-4,4'-biphenylene dicarboxylic acid amide), poly(para-phenylene-2,6-naphthalene dicarboxylic acid amide), poly(2-chloro-para-phenylene terephthalamide), and para-phenylene diamine/2,6-dichloro-para-phenylene diamine/terephthalic acid dichloride) copolymer. In the present invention, the para-aramid may have phenolic hydroxyl groups as the terminal functional groups.

The para-aramid having phenolic hydroxyl groups as the terminal function groups is the hydroxyl-terminated, para-oriented aromatic polyamide in which part or all of the terminal functional groups of the para-oriented aromatic polyamide are hydroxyl groups. Typical examples of the hydroxyl-terminated, para-oriented aromatic polyamide are para-oriented aromatic polyamides having part or all of the molecules chain terminals bound to an aromatic compound having hydroxyl groups.

In the present invention, the low-dielectric resin is not thermally degraded at a temperatures of not higher than 300° C. and has a dielectric constant at 1 MHz of not more than 3.0. Concrete examples of the low-dielectric resin include tetrafluoroethylene resin, perfluoroalkoxy resin, tetrafluoroethylene-hexafluoropropylene copolymer resin, tetrafluoroethylene-ethylene copolymer resin, vinylidene fluoride resin, and polychlorotrifluoroethylene resin (PCTFE). Especially preferable is tetrafluoroethylene resin. Since the dielectric constant of the para-aramid is 3.5, the low-dielectric resin having the dielectric constant of more than 3.0 does not sufficiently reduce the dielectric constant of the composite film. The printed circuit board is soaked in a solder bath in the process, so that the low-dielectric resin that is degraded at the temperatures of not higher than 300° C. is not suitable for the printed circuit board.

The amount of the low-dielectric resin added is not specifically limited but is preferably 20 to 80% by weight, when the total weight of the composite film of the present invention is 100% by weight. The amount of less than 20% by weight does not sufficiently reduce the dielectric constant of the composite film, whereas the amount of more than 80% by weight deteriorates the dimensional stability essential for the printed circuit board. The elastic modulus of the fluororesin is smaller substantially by one order than that of the para-aramid. This makes the linear thermal expansion coefficient of the para-aramid predominant and gives the material of excellent dimensional stability.

In order to improve the handling properties of the film, namely to improve the tearing energy of the film, the film of the present invention may be reinforced with high heat-resistant short fibers and/or pulp. The high heat-resistant short fibers have an aspect ratio (fiber length/fiber diameter) of not less than 50 and a linear thermal expansion coefficient at 200 to 300° C. of within $\pm 50 \times 10^{-6}/°C.$, more preferably of within $\pm 25 \times 10^{-6}/°C.$, and do not melt at a temperature of lower than 230° C., more preferably of lower than 250° C. Concrete examples of organic fibers used as the material of the short fibers of the present invention include: aromatic polyamide, such as poly(para-phenylene terephthalamide) and poly(para-benzamide); aromatic polyesters, such as poly(para-benzoate), poly(para-phenylene terephthalate) and poly(ethylene terephthalate); and aromatic heterocyclic polymers, such as poly(para-phenylene benzo-bis-thiazole) and poly(para-phenylene bis-oxazole). Among them, aromatic polyamides are preferably, and poly(para-phenylene terephthalamide) is especially preferable because of its affinity to the porous film.

In the present invention, the high heat-resistant pulp is the pump composed of fiber which does not melt at a temperature of lower than 230° C., preferably not lower than 250° C. The pulp is preferably made from raw fiber having a linear thermal expansion coefficient of within $\pm 50 \times 10^{-6}/°C$. Concrete examples of organic fibers used as the raw material for the pump of the present invention include: aromatic polyamides such as poly(para-phenylene terephthalamide) and poly(para-benzamide); polyesters such as poly(parabenzoate), poly(para-phenylene terephthalate) and polyethylene terephthalate; and aromatic heterocyclic polymers such as poly(para-phenylene benzo-bis-thiazole) and poly (para-phenylene bisoxazole).

Among them, the organic fibers composed of aromatic polyamides are preferable, and the organic fiber composed of poly(para-phenylene terephthalamide) is especially preferable because of its affinity to the composite film.

The amount of short fiber and pulp is not specifically restricted, but preferably 5 to 50% by weight, when the weight of the para-oriented aromatic polyamide is 100% by weight. The amount of less than 5% by weight does not sufficiently afford a reinforcing effect, whereas the amount of more than 50% by weight generates unevenness of the film by short fiber and/or pump and deteriorates the flatness of the film.

Inorganic fibers are also applicable, except the case in which laser perforation is used to produce a circuit between insulating layers in the manufacturing process of a multilayered printed circuit board that is one of the applications of the prepreg of the present invention. The inorganic fibers may be whiskers, glass fibers, boron fibers, and alumina fibers.

In the composite film of the present invention reinforced with the short fibers and/or pulp, the short fibers are arranged in the film substantially in parallel with the film surface, and the pulps are preferably prepared in opening state of the fibrils of pulp and distributed uniformly. This arrangement especially improves the tear strength. Although a composite film without short fibers has a certain tear resistance at the beginning of tearing, a tear once formed is readily extended. The parallel arrangement of the short fibers to the film surface or the uniform dispersion of the pulp, however, effectively prevents the extension of tearing and improves the tear resistance.

For the purpose of modification, a thermoplastic resin and/or a thermosetting resin may be applied on the composite film of the present invention. Application of a thermosetting resin, especially, epoxy resin, effectively improves the adhesion to a copper foil used to produce an electronic circuit on a flexible printed circuit board.

The composite film of the present invention includes a porous composite film having vacant spaces. The porous composite film of the present invention is a porous film comprising a low-dielectric resin and para-aramid. The film includes para-aramid fibrils and microscopically shows the form of non-woven fabric. The porous composite film of the present invention has a laminate structure of para-aramid fibrils which have diameters of not more than 1 $\mu$m and are arranged in a planar network or in a planar non-woven fabric. The planar arrangement here implies that the fibrils are disposed in parallel to the film surface.

The porous composite film of the present invention has a large number of vacant spaces. The percentage of vacant spaces is 30 to 95% and preferably 35 to 90%. The percentage of vacant spaces of less than 30% is not substantially porous and causes the film to be impregnated with an insufficient amount of a varnish solution, which is obtained by dissolving a thermoplastic resin and/or a thermosetting resin in a solvent, in the process of manufacturing the prepreg as discussed later. The percentage of vacant spaces of more than 95%, on the other hand, causes insufficient strength of the porous composite film and difficulties in handling.

The percentage of vacant spaces is measured as follows. A porous composite film is cut out in square shape (L cm in), and the weight W(g) and the thickness D(cm) are measured.

The amount of the low-dielectric constant resin Wf(g) contained in the film is represented by the equation below, $$Wf=(W \times A/100)$$

where A (% by weight) is the percentage of the added low-dielectric constant resin in the film.

The occupied volume of the low-dielectric constant resin Vf(cm³) is represented by the equation below, $$Vf=Wf/\sigma$$

wherein $\sigma$(g/cm³) is the true specific gravity of the low-dielectric constant resin.

Assuming the true specific gravity of pararamid is 1.45 g/cm³, the occupied volume Va of aramid is represented by the equation below.

$$Va=(W-Ef)/1.45$$

Based on the above values, percentage of vacant spaces is obtained by the following equation.

$$\text{Percentage of vacant spaces (\% of volume)} =100-100 \times (Va+Vf)/(L^2 \times D)$$

The porous film of the present invention has a linear thermal expansion coefficient at 200 to 300° C. (in the planar direction) of within $\pm 50 \times 10^{-6}/°C$., and more preferably of within $\pm 25 \times 10^{-6}/°C$. The smaller linear thermal expansion coefficient implies the better dimensional stability in the planar direction.

The following describes an exemplified process of manufacturing the composite film of the present invention. This is only illustrative and not restrictive in any sense. The typical process of manufacturing the composite film and the porous composite film of the present invention includes the following steps (a) through (d):

(a) obtaining a film-like material from a solution containing 1 to 10% by weight of a para-oriented aromatic polyamide having the inherent viscosity of 1.0 to 2.8 dl/g, 1 to 10% by weight of an alkali metal or alkaline earth metal chloride, and a low-dielectric resin in a polar amide solvent or a polar urea solvent;

(b) keeping the film-like material at a temperature of not lower than 20° C. or not higher than −5° C. in order to make the para-oriented aromatic polyamide deposit from the film-like material;

(c) soaking the film-like material obtained in the step (b) in an aqueous solution or an alcohol solution, in order to elute the solvent and the alkali metal or alkaline earth metal chloride, and drying the resulting film-like material to yield a porous composite film; and (d) rolling the porous composite film obtained in the step (c) to yield a composite film.

A prepreg discussed later may be manufactured. In this case, prior to the rolling process, the dried film-like material is impregnated with a varnish solution, which is prepared by dissolving a thermoplastic resin and/or a thermosetting resin in a solvent, and the solvent is then removed by evaporation. This gives a prepreg including a porous composite film impregnated with the thermoplastic resin and/or the thermosetting resin.

The para-aramid solution used in the step (a) is, for example, preferably prepared in the following manner. In a polar amide solvent or a polar urea solvent dissolving 1 to 10% by weight of an alkali metal or alkaline earth metal chloride, 0.94 to 0.99 moles of a para-oriented aromatic dicarboxylic acid halide is added to 1.0 mole of a para-oriented aromatic diamine. The mixtures is condensation polymerized at a temperature of −20 to 50° C. to give a para-aramid solution having the para-aramid concentration of 1 to 10% by weight. For preparation of a hydroxyl-terminated para-aramid, part of the para-oriented aromatic diamine is replaced with an aromatic compound having amino group and hydroxyl group, and the para-oriented aromatic dicarboxylic acid halide is added to make the number of moles of carboxylic acid halide equal to the total one mole of the amino groups. A predetermined quantity of a low-dielectric resin is mixed with the para-aramid solution thus prepared. This gives a material solution for producing a film-like material. Short fibers may be added for reinforcement in this step.

The porous composite film of the present invention may be impregnated with a thermoplastic resin and/or a thermosetting resin for the purpose of various modifications and used as a prepreg. It is preferable that the porous composite film is impregnated with a thermosetting resin, especially epoxy resin, in order to improve the adhesion to a copper foil used to form an electronic circuit in printed circuit boards. The impregnated amount of the thermoplastic resin and/or the thermosetting resin is preferably from 5 to 60%. The amount of less than 5% does not attain the sufficient adhesion to the copper foil, whereas the amount of more than 60% increases the linear thermal expansion coefficient and does not attain the advantage of the present invention, that is, the low dielectric constant.

The thermoplastic resin used here may be any resin having thermoplasticity and is not specifically restricted, but preferably those having the melting point of not lower than 150° C. It is preferable that the thermoplastic resin has sufficient adhesion to a material of an electronic circuit in case that the prepreg of the present invention is applied to a printed circuit laminated board. The thermoplastic resin may be at least one selected from the group consisting of polyether sulfone, polysulfone, polyether imide, polysulfide sulfone, polycarbonate, polyimide, polyamide imide, and polyether ketone. These thermoplastic resins may be used alone or in appropriate combinations.

The thermosetting resin is not specifically restricted, but may be at least one selected from the group consisting of epoxy resin, bismaleimide-triazine resin, polyimide resin, diallyl phthalate resin, unsaturated polyester resin, cyanate resin, and aryl-modified polyphenylene ether resin. These thermosetting resins may be used alone or in appropriate combinations.

The prepreg manufactured according to the method of the present invention can be thinned. The film thickness of less than 10 μm, however, may have wrinkles and difficulties in handling. The thickness of the para-aramid film is preferably 10 to 150 μm, or more preferably 30 to 100 μm. Although the upper limit is not specified especially, the thickness of more than 150 μm does not attain the important advantage of the laminated board, that is, light in weight and thin.

In the present invention, the method of impregnating a porous composite film with a thermoplastic resin and/or a thermosetting resin is not specifically restricted. Any known methods of impregnating paper or glass cloth with a thermosetting resin may be applied. For example, a varnish solution is prepared by dissolving a composition containing a thermoplastic resin and a thermosetting resin in a solvent, and applied onto the composite film for impregnation, and then the solvent is evaporated to yield a prepreg.

The prepreg thus prepared has a low linear thermal expansion coefficient, excellent mechanical strength, and favorable adhesion to a metallic foil, and is thereby favorably applicable as a base substrate for a printed circuit board, a laminated board, and especially a flexible printed circuit board. The base substrate for a printed circuit board and the laminated board may be manufactured according to a conventional method (for example, 'Introduction to Printed Wiring Board' Electronic Technology, Special Vol. June, 1986). A printed circuit laminated board is prepared by laying the prepreg of the present invention as an insulating layer upon a metallic foil as a conductive layer. The metallic foil may be gold, silver, copper, nickel, aluminum, and the like.

EXAMPLES

The present invention is described concretely with the following examples. These examples are only illustrative and not restrictive in any sense.

(1) Inherent Viscosity

The flow time was measured at 30° C. with a capillary viscometer, with respect to 96 to 98% sulfuric acid and a solution obtained by dissolving 0.5 g of the para-aramid polymer in 100 ml of 96 to 98% sulfuric acid. The inherent viscosity was then calculated from the ratio of the observed flow time according to the equation given below:

$$\text{Inherent Viscosity} = ln(T/T_0)/C \; [unit: \; dl/g]$$

where T and $T_0$ denote the flow time of the sulfuric acid solution of para-aramid and sulfuric acid, respectively, and C represents the para-aramid concentration (g/dl) in the sulfuric acid solution of para-aramid.

(2) Tensile Test

A test piece was punched out of the composite film, the prepreg, or the prepreg-cured sheet with a dumbbell cutter manufactured by Dumbbell Corp., and the tensile strength was measured according to JIS K-7127 with Instron universal tensile tester model 4301 manufactured by Instron Japan Corp.

(3) Peeling Strength

The peeling strength was measured according to JIS C-6481.

(4) Linear thermal expansion coefficient

The linear thermal expansion coefficient was measured according to ASTM D696 with a thermal analyzer TMA120 manufactured by Seiko Electronics Co., Ltd. and calculated by the following equation. A test piece that had not been annealed prior to the measurement was re-measured after being heated to 300° C. in the analyzer.

$$\alpha 1 = \Delta L / L_0 \cdot \Delta T$$

In the formula, $\alpha 1$ is a linear thermal expansion coefficient (/°C.), $\Delta L$ is a variation in length of the test piece, $L_0$ is a length of the test piece prior to the test, and $\Delta T$ is a temperature difference (° C.).

(5) Dielectric Constant

Except in example 1, the dielectric constants were measured according to ASTM-D150 by using Precision LCR meter (HP-4284A manufactured by Yokokawa Hewlett-Packard Company) with an electrode (SE-70 manufactured by Ando Electric Company). That is, the test piece was cut out in 5 cm-square, and silver-painted. After drying at 120° C. for 2 hours, and further keeping at 22° C., 60% RH for 90 minutes for conditioning, and the dielectric constant was measured at 1 MHz.

In example 1, the dielectric constants was measured with a modified method according to JIS K6911 using Precision LCR meter (HP-4284A manufactured by Yokokawa Hewlett-Packard Company) with an electrode (HP16451B manufactured by Yokokawa Hewlett-Packard Company). That is, the test piece was cut out in 5 cm-square, and silver-painted. After drying at 120° C. for 2 hours, and further keeping at 22° C., 60% RH for 90 minutes for conditioning, and the dielectric constant was measured at 1 MHz.

Dielectric constants obtained according to JIS K6911 are generally almost same with those according to ASTM-D150.

(6) Water Absorption

The test piece was a 70-mm square piece of a prepreg-cured sheet. The test piece was dried at 120° C. for two hours and kept still under the conditions of 25° C. and the relative humidity of 65% for 24 hours. The variation in weight was then measured.

(7) Tearing energy

A test piece was cut out of porous film, prepreg, or cured sheet of prepreg with a dumbbell cutter (for JIS K-7128-1991C manufactured by Dumbbell Corp., and the tensile strength was measured according to JIS K-7127-1991C with Instron universal tensile tester model 4301 manufactured by Instron Japan Corp. In the graph showing the result of tensile strength measurement (longitudinal axis: charge(kg/mm), horizontal axis: displacement(cm)), the tearing energy was defined as the closed area made by the measured S—S curve, the line of charge zero and the vertical line of breakage.

EXAMPLE 1

(1) Synthesis of hydroxyl-terminated poly(para-phenylene terephthalamide)

Hydroxyl-terminated poly(para-phenylene terephthalamide) (hereinafter referred to as hydroxyl-terminated PPTA) was synthesized in a 3-liter separable flask with an agitating blade, a thermometer, a nitrogen flow-in pipe, and a powder inlet. In the flask sufficiently dried, 149.2 g of calcium chloride dried at 200° C. for two hours were added to 2220 g of N-methyl-2-pyrrolidone (hereinafter referred to NMP). The flask was then heated to 100° C. The flask was cooked down to room temperature after complete dissolution of calcium chloride, and 67.2 g of para-phenylene diamine (hereinafter referred to as PPD) and 6.7 g of 4-amino-meta-cresol (hereinafter referred to as 4-AMC) were added and completely dissolved. While the solution was kept at the temperature of 20±2° C., 130.7 g of terephthalic acid dichloride (hereinafter referred to as TPC) were added in ten portions at approximately 5 minutes intervals. The solution was kept at the temperature of 20±2° C. for one hour for maturation and then stirred under reduced pressure for 30 minutes for elimination of air bubbles. The polymer solution obtained (polymer dope) showed optical anisotropy. Part of the polymer solution was sampled, and polymer was taken from the sampled polymer solution re-precipitated in water. The observed inherent viscosity of the hydroxyl-terminated PPTA thus obtained was 2.11 dl/g.

(2) Production of composite film of hydroxyl-terminated PPTA and low-dielectric resin A composite film consisting of the hydroxyl-terminated PPTA, a low-dielectric resin (polytetrafluoroethylene fine particles (hereinafter referred to as PTFE fine particles: Lubron L-5F manufactured by DAIKIN INDUSTRIES LTD.)), and reinforcing aramid short fibers was prepared from the polymer solution of the above process 1). A concrete procedure weighed 1.2 g of aramid short fibers having the fiber length of 1 mm and 8.7 g of PTFE fine particles having the dielectric constant of 2.2 in a 500 ml separable flask with an agitating blade, a nitrogen injection pipe, and a liquid inlet, added 100 g of the polymer solution of the above process 1), and stirred the mixture in a stream of nitrogen. When the aramid short fibers and the PTFE fine particles are sufficiently dispersed, 200 g of NMP were added to the mixture for dilution. The solution thus obtained was applied on a glass plate with a bar coaster (film thickness 1.2 mm) manufactured by Tester Industries Co., Ltd., in order to form a film-like material. The glass plate was placed in a covered aluminum bat and heated in a 80° C.-oven for approximately 10 minutes. The aluminum bat included a mop previously wetted with pure water and kept in the 80° C.-oven. The hydroxyl-terminated PPTA deposited to form a film-like material on the glass plate. The glass plate was then soaked in de-ionized water, and the film-like material was peeled off the glass plate after five minutes. The film-like material was sufficiently washed with a flow of de-ionized water. The wet film-like material was taken out of water and wiped. The wiped film-like material was inserted in aramid felt and then glass cloth. The film-like material interposed between filter paper and glass cloth was covered with an aluminum plate and then with a nylon film. The nylon film and the aluminum plate were sealed with gum, and a conduit was attached for reduction of pressure. The whole was placed in a hot oven and heated at 120° C. under reduced pressure, so that the film-like material was dried. The film-like material had vacant spaces and impregnated with water as shown by the subsequent measurement. The dried film-like material was sandwiched in aluminum plates of 0.8 mm in thickness and hot rolled with a small-sized roller manufactured by Daito Manufacturing Inc. The roll temperature was 165° C. and the linear pressure was 80 kg/cm. The composite film was soaked in water and under the ultrasonic waves for ten minutes. There was no significant difference between the observed weight of the composite film before the ultrasonic treatment and the same after the treatment. The same procedure, however, increased the weight of the dried film-like material before the hot rolling process by 22.6%. This results shows that the hot rolling process eliminates the vacant spaces included in the film-like material.

EXAMPLE 2

Figure 3:
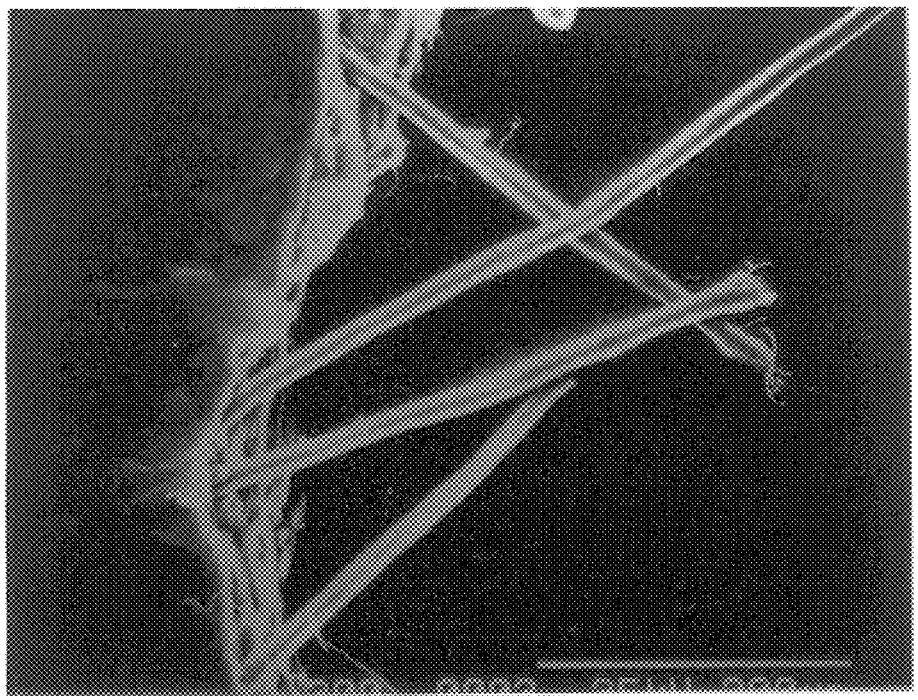
FIG. 3 is a photograph of a scanning electron microscope (magnification of 200) showing the form of fibrils of a composite film obtained in Example 2 (structure of a torn portion of a composite film).
Figure 5:
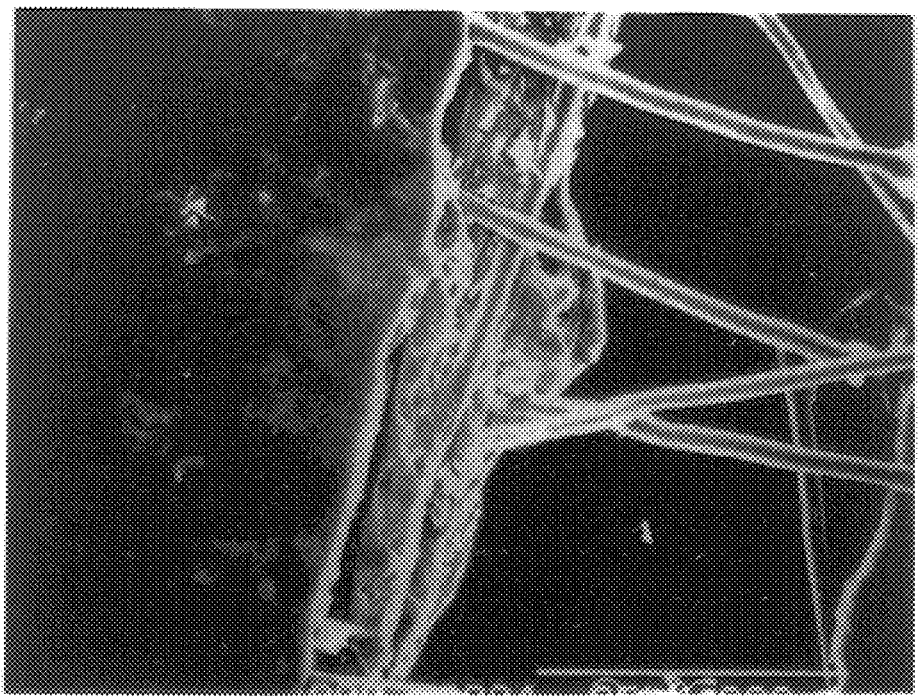
FIG. 5 is a photograph of a scanning electron microscope (magnification of 200) showing the form of fibrils of a composite film obtained in Example 2 (structure of a torn portion of a composite film).

A composite film was prepared in the same manner as the process 2) of Example 1, except that the amount of PTFE fine particles added was 10.4 g. Parts of the dried film-like material and the composite film sintered at 350° C. were torn. FIGS. 1, 3, and 5 respectively show the results of observation of the torn portions with a scanning electron microscope. The magnifications of FIG. 1, FIG. 3 and FIG. 5 are 150, 200 and 200, respectively.

Figure 2:
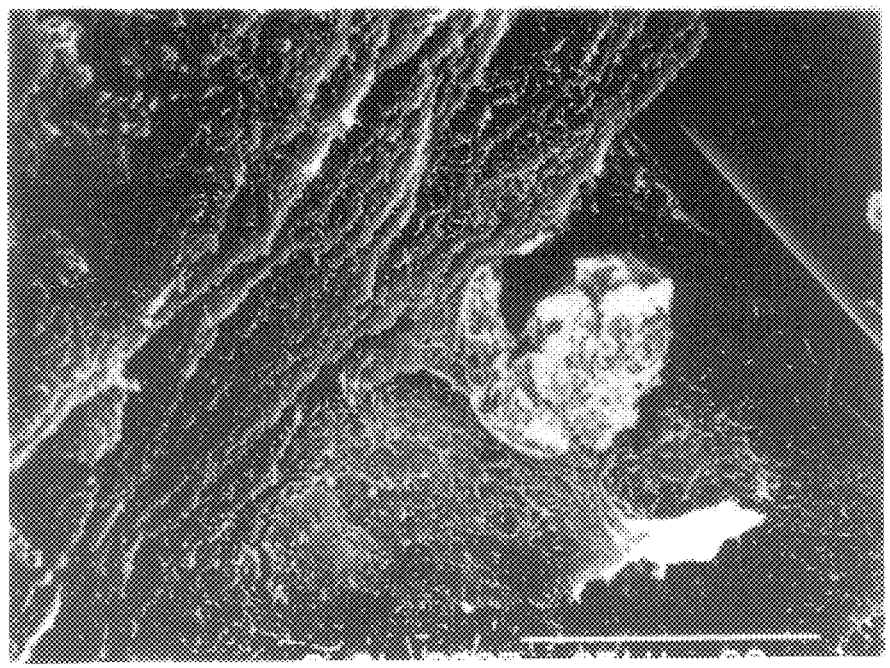
FIG. 2 is a photograph of a scanning electron microscope (magnification of 2000) showing the form of fibrils of a composite film obtained in Example 2 (structure of the fractured surface of a torn portion of a porous composite film).
Figure 4:
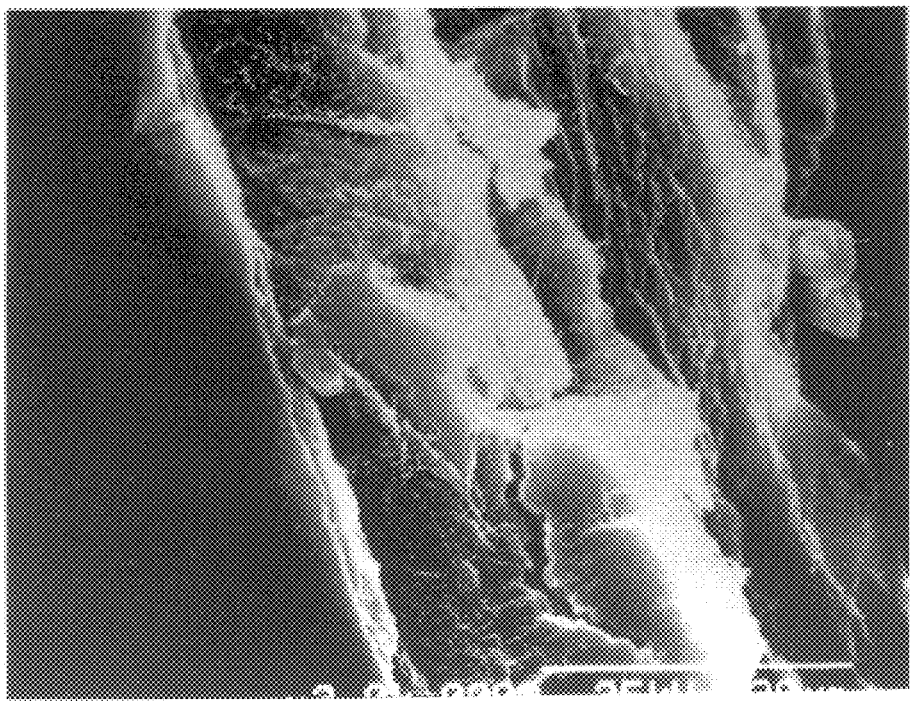
FIG. 4 is a photograph of a scanning electron microscope (magnification of 2000) showing the form of fibrils of a composite film obtained in Example 2 (structure of a torn portion of a composite film).
Figure 6:
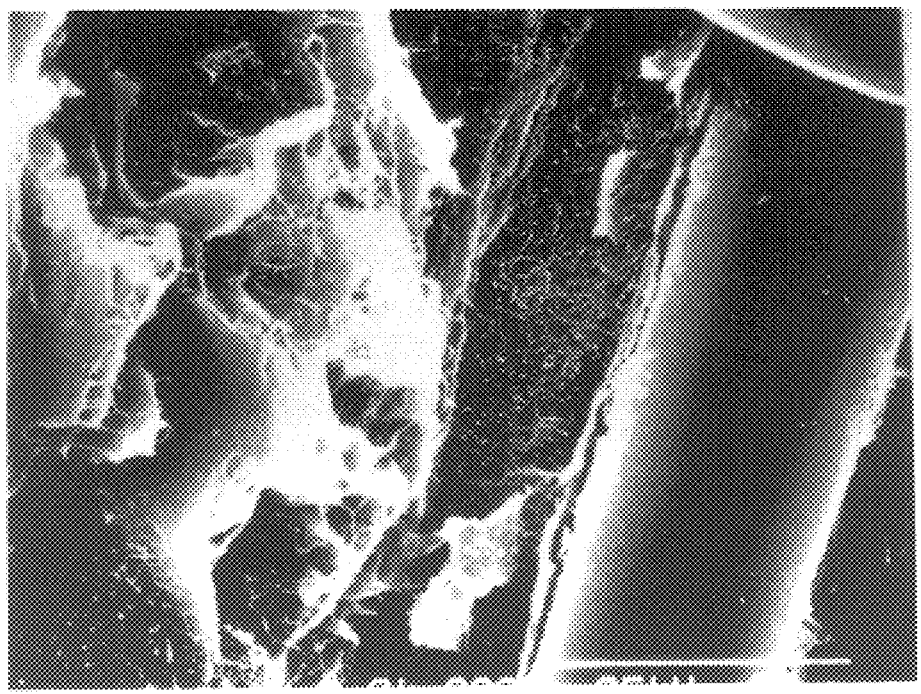
FIG. 6 is a photograph of a scanning electron microscope (magnification of 2000) showing the form of fibrils of a composite film obtained in Example 2 (structure of a torn portion of a composite film).

FIGS. 2, 4, and 6 are photographs showing a part of the fractured surfaces of FIGS. 1, 3, and 5 observed with the scanning electron microscope having the magnification of 2000. FIG. 1 shows the state in which aramid short fibers are seen from the torn composite film. The aggregated PTFE fine particles are covered with the hydroxyl-terminated PPTA on the film surface. On the center of the photograph of FIG. 2, it is shown that aggregated PTFE fine particles are taken in the layered structure of the hydroxyl-terminated PPTA. In the photograph of FIG. 3, aggregated PTFE fine particles are crushed to plain faces by rolling. FIG. 4 shows the state in which primary particles of the PTFE aggregate are almost perfectly agglomerated. In the photograph of FIG. 6, part of the composite film is torn off in a fibrous manner since the PTFE section has been sintered. As clearly shown in any of these photographs, the hydroxyl-terminated PPTA section has a number of fibril layers, and fibrils extend in a planar manner in each layer.

The physical properties of the composite film were measured. The dielectric constant was 2.6, and the tensile strength was observed as shown in Table 1. The water absorption of the composite film was 0.9%.

TABLE 1

| Example/Comparative Example | Tensile Strength kg/mm$^2$ | Tensile Elongation % |
| --- | --- | --- |
| Example 2 Composite film | 7.3 | 2.8 |
| Sintered composite film | 7.2 | 2.1 |
| Example 3 Cured substance | 9.1 | 3.1 |

EXAMPLE 3

A water-wetted film-like material consisting of the hydroxyl-terminated PPTA, the PTFE fine particles, and the reinforcing aramid short fibers was obtained and dried to give a porous composite film in the same manner as Example 2. A prepreg, a base substrate for a printed circuit board, and a laminated board were then prepared from the porous composite film.

(1) Preparation of Varnish

A solvent (methyl ethyl ketone, hereinafter referred to as MEK) was added to a mixture of the following composition. The mixture in the solvent was heat refluxed in a 300 ml-conical flask with a reflux pipe for 90 minutes to yield a varnish while being stirred with a magnetic stirrer. Composition of varnish: (parts by weight)

| | | |
| --- | --- | --- |
| Primary agent | Sumi Epoxy ESB-400 (manufactured by Sumitomo Chemical Co., Ltd.) | 44 |
| | Sumi Epoxy ESCN-195 (manufactured by Sumitomo Chemical Co., Ltd.) | 28 |
| Curing agent | Phenol Novolak (manufactured by Gun-ei Chemical Industry Co., Ltd.) | 28 |
| Catalyst | 2-methyl-4-ethyl imidazole (manufactured by Shikoku Chemicals Corp., Curesol 2E4MZ) | 0.4 |

(2) Manufacture of Prepreg

The porous composite film was interposed between aramid paper, then aluminum plates of 0.2 mm in thickness, aramid felt, and finally aluminum plates of 1 mm in thickness. This sandwich-like structure was pressed under the condition of 10 kg/cm$^2$ at 280° C. for 10 minutes and then annealed. The porous composite film was then cut into a 100-mm square piece, and the varnish prepared in the process (1) was applied on both surfaces of the film piece. The film piece was interposed between fluororesin films (trade name: Toyofron 50F manufactured by Toray Industries Inc.) to prevent the solvent from being vaporized, and then pressed to spread the varnish uniformly. The film piece was left for ten minutes to be uniformly impregnated with the varnish. The varnish-impregnated film piece was then placed on glass cloth (Product Number: YES-2101 manufactured by Nippon Glass Fiber Co., Ltd.) and heated at 150° C. for 3 minutes. This removed the solvent and half cured the epoxy resin to give a prepreg. In order to reduce the impregnated amount of the epoxy resin, the film piece may be rolled at room temperature prior to the half cure of the epoxy resin. In this experiment, however, the prepreg was prepared by simply half curing the epoxy resin.

(3) Cure of prepreg alone and laminate with copper foil and measurement of physical properties The prepreg prepared in the process (2) was placed in a 45-$\mu$m gap between spacers, interposed between Teflon sheets, and press-cured at 175° C. The prepreg was interposed between copper foils of 35 $\mu$m in thickness, placed in a 115-$\mu$m gap between spacers, and press-cured at 175° C. The cured prepreg alone had the water adsorption of 0.9% and the linear thermal expansion coefficient of $24 \times 10^{-6}$/°C. Table 1 shows the tensile strength of the cured prepreg. The peeling strength from the copper foil was 0.7 kg/cm.

EXAMPLE 4

To 1237 g of the polymerization solution of hydroxyl-terminated PPTA prepared as the same manner with Example 1(1), 13.92 g of aramid short-fiber (mean fiber length of 1 mm), 4.64 g of aramid short-fiber (mean fiber length of 3 mm), and 2474 g of NMP were added and stirred under nitrogen atmosphere, and defoamed polymer solution was prepared. The polymer solution (1000 g) was transferred into another vessel having agitating blade, and 20 g of PTFE fine particle was added to the solution, thus polymer solution was prepared. The polymer solution was coated on PET film using a coater manufactured by Tester Sangyo Company. The obtained film was washed and dried as the same manner with Example 1(2) to give porous composite film. The film was impregnated with the thermosetting varnish same with Example 3, and thus obtained prepreg was cured. Table 2 shows the linear expansion coefficient, the dielectric constant at 1 MHz and the water absorption of the cured product.

COMPARATIVE EXAMPLE 1

The dielectric constant of a commercially available polyimide film (Kapton, manufactured by Toray-Du Pont Company) was measured in the value of 3.3.

COMPARATIVE EXAMPLE 2

A cured product was obtained as the same manner with Example 4, except that the PTFE fine particle was not used.

The linear expansion coefficient, the dielectric constant at 1 MHz and the water absorption of the cured product are shown in Table 2.

TABLE 2

|  | Dielectric constant | Linear thermal expansion coefficient (× $10^{-6}$ /° C.) | Water absorption (%) |
| --- | --- | --- | --- |
| Example 4 | 3.39 | 11.4 | 1.0 |
| Comparative Example 2 | 4.11 | 8.9 | 1.5 |

REFERENTIAL EXAMPLE 1

In a 3000 ml separable flask, 1283 g of NMP for dilution, 8.25 g of aramid short-fiber (mean fiber length of 1 mm) and 2.75 g of aramid short-fiber (mean fiber length of 3 mm) were added and stirred under a nitrogen stream. To this fiber dispersed solution, 917 g of hydroxyl-terminated PPTA solution prepared as the same manner with Example 1 was added and further stirred. After homogenizing, the solution was defoamed and polymer solution was obtained. The polymer solution was coated on PET film using a coater manufactured by Tester Sangyo Company. The obtained film was washed and dried as the same manner with Example 1(2). The tensile strength of the film was measured. Tearing strength was measured and the tearing energy was calculated. The results are shown in Table 3.

REFERENTIAL EXAMPLE 3

Porous film was obtained in the same manner with Referential Example 1, except not adding the aramid short-fibers in the preparation process of polymer solution for coating. The tensile strength of the film was measured. Tearing strength was measured and the tearing energy was calculated. The results are shown in Table 3.

TABLE 3

|  | Aramid short-fiber | Tensile strength (kg/mm$^2$) | Tensile elongation (%) | Tearing energy (kg/mm × mm) |
| --- | --- | --- | --- | --- |
| Referential Example 1 | used | 5.8 | 2.1 | 9.2 |
| Referential Example 2 | not used | 10.8 | 6.6 | 3.2 |

As shown in Table 3, as for the composite film not containing PTFE fine particles, by reinforcing with aramid short-fiber, the tensile stress is lowered but the tearing energy is increased. Accordingly, as for the composite film containing PTFE fine particles of the present invention, the same effect is expected by reinforcing with aramid short-fiber.

The present invention provides a composite film that has a low dielectric constant, favorable mechanical strength as a printed circuit board, homogeneous structure (planar film surface), light weight, and a low linear thermal expansion coefficient, and the film is useful as a base substrate for a flexible printed circuit board.

What is claimed is:

1. A composite film comprising a continuous phase of para-oriented aromatic polyamide and a phase of low-dielectric resin, said film having a dielectric constant at 1 MHz of not more than 3.2 and a linear thermal expansion coefficient at 200 to 300° C. of within ±50×$10^{-6}$/°C., wherein the continuous phase of para-oriented aromatic polyamide comprises fibrils having a diameter of not more than 1 μm, and the fibrils are planarly arranged and layered in the form of a network or a non-woven fabric.

2. A composite film according to claim 1, wherein said film further comprises heat-resistant short fiber and/or pulp which does not melt at a temperature of lower than 230° C.

3. A composite film according to claim 2, wherein the short fiber has an aspect ratio of not less than 50 and a linear thermal expansion coefficient at 200–300° C. of within ±50×$10^{-6}$/°C., and exists in the film as a planarly arranged form parallel to the film plane.

4. A composite film according to claim 2, wherein the pulp is prepared from a raw fiber having a linear thermal expansion coefficient at 200–300° C. of within ±50×$10^{-6}$/°C., and exists as a uniformly dispersed state in the film.

5. A composite film according to claim 1, wherein the low-dielectric resin is not thermally degraded at a temperature of not higher than 300° C. and has a dielectric constant at 1 MHz of not more than 3.0.

6. A composite film according to claim 1, wherein the low-dielectric resin is selected from the group consisting of a tetrafluoroethylene resin, a perfluoroalkoxy rein, a tetrafluoroethylene-hexafluoropropylene copolymer resin, a tetrafluoroethylene-ethylene copolymer resin a vinylidene fluoride resin, and a chlorotrifluoroethylene resin.

7. A composite film according to claim 1, wherein a ratio of the low-dielectric resin is 20 to 80% by weight of said composite film.

8. A composite film according to claim 1, wherein the para-oriented aromatic polyamide is selected from the group consisting of poly(para-phenylene terephthalamide), poly(para-benzamide), poly(4,4'-benzanilide terephthalamide), poly(para-phenylene-4,4'-biphenylene dicarboxylic acid amide), poly(para-phenylene-2,6-naphthalene dicarboxylic acid amide), poly(2-chloro-para-phenylene terephthalamide), and para-phenylene diamine/2,6-dichloro-para-phenylene diamine/terephthalic acid dichloride) copolymer.

9. A flexible printed circuit board comprising the composite film according to any one of claims 1, 2, 5, 6, 7 or 8, as a base substrate.

10. A composite film according to claim 1, wherein the composite film is a porous composite film having a percentage of vacant spaces of 30 to 95 volume %.

11. A prepreg comprising a porous composite film according to claim 10, wherein the composite film is impregnated with a thermoplastic resin and/or a thermosetting resin.

12. A prepreg according to claim 11, wherein the thermoplastic resin is selected from the group consisting of a polyether sulfone, a polysulfone, a polyether imide, a polysulfide sulfone, and a polycarbonate.

13. A prepreg according to claim 11, wherein the thermosetting resin is selected from the group consisting of an epoxy resin a bismaleimide-triazine resin, a polyimide resin, a diallyl phthalate resin, an unsaturated polyester resin, a cyanate resin, and an aryl-modified polyphenylene ether resin.

14. A base substrate for a printed circuit board comprising a prepreg according to any one of claims 11 to 13.

15. A laminated board for a printed circuit board comprising the base substrate for a printed circuit board of claim 14 as an insulating layer and a metallic foil as a conductive layer.

16. A process of manufacturing the composite film of claim 1 comprising:
  (a) obtaining a film material from a solution containing 1 to 10% by weight of a para-oriented aromatic polyamide having an inherent viscosity of 1.0 to 2.8 dl/g, 1 to 10% by weight of an alkali metal or alkaline earth metal chloride, and a low-dielectric resin in a polar amide solvent or a polar urea solvent;
  (b) depositing the para-oriented aromatic polyamide from the film material;
  (c) soaking the film material obtained in (b) in an aqueous solution or an alcohol solution in order to elute the solvent and the alkali metal or alkaline earth metal chloride, and then drying the resulting film material to yield a porous composite film; and
  (e) rolling the porous composite film obtained in (c) to yield a composite film.

* * * * *